United States Patent
Ibrir

(10) Patent No.: US 11,418,133 B2
(45) Date of Patent: Aug. 16, 2022

(54) SYSTEM AND METHOD TO CONTROL SLIP-STICK STAGES

(71) Applicant: King Fahd University of Petroleum and Minerals, Dhahran (SA)

(72) Inventor: Salim Ibrir, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 355 days.

(21) Appl. No.: 16/784,987

(22) Filed: Feb. 7, 2020

(65) Prior Publication Data

US 2021/0257935 A1   Aug. 19, 2021

(51) Int. Cl.
*H02N 2/00* (2006.01)
*H01L 41/04* (2006.01)
*H02N 2/02* (2006.01)

(52) U.S. Cl.
CPC .......... *H02N 2/0075* (2013.01); *H01L 41/042* (2013.01); *H02N 2/025* (2013.01)

(58) Field of Classification Search
CPC .......... H02N 2/12; H02N 2/16; H02N 2/0065; H02N 2/163; H01L 41/09; H01L 41/1871; H01L 41/1873; G02B 7/10
See application file for complete search history.

(56) References Cited

U.S. PATENT DOCUMENTS

| 7,738,210 | B2 | 6/2010 | Matsuki |
| 8,203,300 | B2* | 6/2012 | Krah ...................... G05B 21/02 318/636 |
| 8,686,740 | B2 | 4/2014 | Morishima |
| 2006/0158910 | A1* | 7/2006 | Hunt ...................... H02M 3/156 363/35 |
| 2020/0395871 | A1* | 12/2020 | Kortschack ............ H02N 2/025 |

OTHER PUBLICATIONS

Ibrir, New Control Schemes for Stick-Slip Micro-Positioning Stages, Jul. 16-19, 2019 IEEE 15th International Confernce on Control and Automation (ICCA), pp. 142-147. (Year: 2019).*

(Continued)

*Primary Examiner* — Emily P Pham
(74) *Attorney, Agent, or Firm* — Oblon, McClelland, Maier & Neustadt, L.L.P.

(57) ABSTRACT

A system to control slip-stick stages that includes a slip-stick stage including an actuator and a processor coupled to the actuator to obtain a frequency, a number of measurement samples, and a voltage; determine a time period based on the number of measurement samples and the frequency; sample a displacement of the actuator during the time period. The system functions to calculate an error value based on the displacement and a reference position; determine a step value based on the error value and a modulation protocol. The modulation protocol includes a proportional modulation protocol or a proportional-integral modulation protocol to generate a control signal based on the step value, the frequency and the voltage based on an integral of a function of voltage and a Heaviside function according to a direction specified by a sign of the step value; and transmit the control signal to the actuator.

20 Claims, 10 Drawing Sheets

(56) References Cited

OTHER PUBLICATIONS

Boudaoud et al., Voltage/Frequency Rate Dependent Modeling for Nano-Robotic Systems based on Piezoelectrc Stick-Slip Actuators, Oct. 9-14, 2016 IEEE/RSJ International Conference on Intelligent Robots and Systems (IROS), pp. 5297-5303. (Year: 2016).*

Rakotondrabe, et al. ; Voltage/frequency proportional control of stick-slip micropositioning systems. ; HAL archives-ouvertes ; Nov. 20, 2008 ; 8 Pages.

Wang , et al. ; A Stick-Slip Positioning Stage Robust to Load Variations ; IEEE/ASME Transactions on Mechatronics, vol. 21, No. 4 ; Aug. 2016 ; 9 Pages.

Cheng, et al. ; A Neural-Network-Based Controller for Piezoelectric-Actuated Stick-Slip Devices ; IEEE Transactions on Industrial Electronics ; 2017 ; 11 Pages.

* cited by examiner

SYSTEM AND METHOD TO CONTROL SLIP-STICK STAGES

STATEMENT OF ACKNOWLEDGEMENT

This work was supported by the Deanship of Scientific Research of King Fahd University of Petroleum and Minerals under grant KAUST004.

BACKGROUND

Technical Field

The present disclosure is directed generally to micro-positioning of piezoelectric actuators, and, more particularly, to methods, computer readable media, and systems for high-precision control of piezoelectric stick-slip stages using P and PI sawtooth modulated inputs.

Background

In recent decades, the engineering world has witnessed tremendous development and success in the technology of piezoelectric actuators. (See, P. P. et al., "Nanopositioning technologies: Fundamentals and applications", ser. Engineering. Springer International Publishing, 2016, ch. "A review of stickslip nanopositioning actuators", pp. 1-32, which is incorporated herein by reference). It has become feasible to manufacture micro- and nano-positioners, intelligent control systems and micro-tools for different precision motion applications. Due to the compact positioning property of advanced mechatronics systems, it has become possible to combine sub-nm resolution with a high straightness and travel ranges up to 1.5 m.

Piezoelectric actuators (or PEAs) are based on the principle of piezoelectric effect. Roughly speaking, the piezoelectric actuator converts an electrical signal into a precisely controlled physical displacement. If the displacement is prevented, a blocking force is simultaneously developed. The high-precision motion control afforded by the piezoelectric actuators, is mainly used to finely adjust machining tools, lenses, mirrors, or other equipment. Furthermore, piezoelectric actuators can be used to control hydraulic valves, act as a small-volume pump or special-purpose motor, and in various applications requiring precise movement or force.

Stick-slip actuators are special class of actuators that comprise piezoelectric actuators and end-effector stages that stick and slide on the piezoelectric materials. The stick-slip motion and behaviors are ubiquitous in physics, material science, drilling mechanics, optics engineering, electrical engineering, computer science and bio-material science. (See, S. Liang, W. Rong, S. Zhang, and W. Zhang, "A novel friction model for stick-slip driving," in of 2014 IEEE International Conference on Mechatronics and Automation, Tianjin, China, Aug. 3-6, 2014, pp. 429-434; L. Ma'rton and B. Lantos, "Modeling, identification, and compensation of stick-slip friction," IEEE Transactions on Industrial Electronics, vol. 54, no. 1, pp. 511-521, 2007; J. Y. Peng and X. B. Chen, "Modeling of piezoelectric-driven stick-slip actuators," IEEE Transactions on Mechatronics, vol. 16, no. 2, pp. 394-399, 2011; J. Korycki, "Mathematical model of the stick-slip phenomenon," Wear, vol. 55, pp. 261-263, 1979; J. Kang, C. M. Krousgrill, and F. Sadeghi, "Wave pattern motion and stick-slip limit cycle oscillation of a disc brake," Journal of Sound and Vibration, vol. 325, pp. 552-564, 2009; and F. Mar'in, F. Alhama, and J. A. Moreno, "Modeling of stick-slip behavior with different hypothesis," International Journal of Engineering Science, vol. 60, pp. 13-24, 2012, which are incorporated herein by reference). The research in developing micro and nano actuators based on the stick-slip mechanism has seen tremendous progress in recent decades. Generally speaking, these compact and highly efficient mechanisms can be employed in precision control applications where standard electromechanical motors/actuators are replaced by very precise piezoelectric devices.

Some have proposed a control algorithm for the control of piezoelectric-driven stick-slip actuators where the PEA is presenting a hysteresis effect. (See, J. Y. Peng and X. B. Chen, "Modeling of piezoelectric-driven stick-slip actuators," IEEE Transactions on Mechatronics, vol. 16, no. 2, pp. 394-399, 2011, which is incorporated herein by reference) The effect of load variation on stick-slip stages has been studied. (See, Y. Wang, J. Zhu, M. Pang, J. Luo, S. Xie, M. Liu, L. Sun, C. Zhou, M. Tan, J. Ge, Y. Sun, and C. Ru, "A stick-slip positioning stage robust to load variations," IEEE/ASME Transactions on Mechatronics, vol. 21, no. 4, pp. 2165-2173, 2016, which is incorporated herein by reference). Some have proposed a control technique based upon voltage/frequency proportional control of stick-slip micro-positioning systems. (See, M. Rakotondrabe, Y. Haddab, and P. Lutz, "Voltage/frequency proportional control of stick-slip micropositioning systems," IEEE Transactions on Control systems Technology, vol. 16, no. 6, pp. 1316-1322, 2008, which is incorporated herein by reference). Robust adaptive stick-slip friction compensation has been studied. (See, S. W. Lee and J. H. Kim, "Robust adaptive stick-slip friction compensation," IEEE Transactions on Industrial Electronics, vol. 42, no. 5, pp. 474-479, 1995, which is incorporated herein by reference). A neural-network-based controller has been proposed for piezoelectric-actuated stick-slip devices. (See, L. Cheng, W. Liu, C. Yang, T. Huang, Z. Hou, and M. Tan, "A neural- network-based controller for piezoelectric-actuated stick-slip devices," IEEE Transactions on Industrial Electronics, vol. 65, no. 3, pp. 2598-2607, 2018, which is incorporated herein by reference). Other papers have presented research on the control of stick-slip actuators. (See, T. Cheng, M. He, H. Li, H. Zhao, and H. Gao, "A novel trapezoid-type stick-slip piezoelectric linear actuator using right circular flexure hinge mechanism," IEEE Transactions on Industrial Electronics, vol. 64, no. 7, pp. 5545-5552, 2017; R. J. E. Merry, J. L. Holierhoek, M. J. G. van de Molengraft, and M. Steinbuch, "Gain scheduling control of a walking piezo actuator," IEEE/ASME Transactions on Mechatronics, vol. 19, no. 3, pp. 954-962, 2014; and R. J. E. Merry, M. G. J. Maassen, M. J. G. van de Molengraft, and N. van de Wouw, "Modeling and waveform optimization of nano-motion piezo stage," IEEE/ASME Transactions on Mechatronics, vol. 16, no. 4, pp. 615-625, 2011, which are incorporated herein by reference).

High precision motions provided by stick-slip piezoelectric actuators can be plagued by some difficulty in the control of such devices. The presence of hysteric effects requires robust control feedback to compensate for the uncertainty of the hysteresis input. Additionally, the control of the motion of the piezo material should be designed to go along with the physical principle of sticking and sliding of the end effector that may carry other loads.

Some implementations of the present disclosure were conceived in light of the above-mentioned problems and limitations of conventional machine translation techniques, methods and tools.

SUMMARY

Accordingly, it is one object of the invention to provide a modulated-saw-tooth input that is generated to make the micro-stage track constant in time-varying bounded references. More precisely, an integer number of desired steps can be generated from the instantaneous tracking-error signal. According to the sign of the steps, a corresponding saw-tooth voltage is generated.

Some implementations can include two possible control schemes based on tracking error information and its integral. Real-time simulations show that the proportional and the integral control scheme provides an error of 0.1 µm after a short transient regime. However, a simple proportional control scheme was found efficient to steer the stage from one position to another one within an error of about plus or minus one µm. It is another object of the invention to provide a control system with the property of being independent from the system model and easily implementable on stand-alone computers.

Some implementations can include a system to control slip-stick stages. The system can include a slip-stick stage having an actuator; and one or more processors coupled to the actuator and a nontransitory computer readable storage having software instructions stored thereon that, when executed, cause the one or more processors to perform operations. The operations can include a) obtaining a frequency, a number of measurement samples, and a voltage, b) determining a time period based on the number of measurement samples and the frequency, and c) sampling a displacement of the actuator during the time period.

The operations can also include, for each sample taken during the time period: d) calculating an error value based on the displacement and a reference position, e) determining a step value based on the error value and a modulation protocol, wherein the modulation protocol includes one of a proportional modulation protocol or a proportional-integral modulation protocol, f) generating a control signal based on the step value, the frequency and the voltage, wherein the control signal is based on an integral of a function of voltage and a Heaviside function according to a direction specified by a sign of the step value, and g) transmitting the control signal to the actuator.

In some implementations, the actuator can include a piezo electric actuator. In some implementations, the actuator can include a piezo electric actuator and the stick-slip stage can include an end effector.

In some implementations, the proportional modulation protocol includes determining the step value according to:

$$u_{step} = \text{Int}(Ke(t)),$$

where K is a constant, e(t) is the error value and Int(s) represent the integer value of a real s.

In some implementations, the proportional-integral modulation protocol includes determining the step value according to:

$$u_{step}(t) = \text{Int}(K\,e(t) + K_I \int_0^t e(s)ds)$$

where K is a constant, t is time, e(t) is the error value and Int(s) represent the integer value of a real s.

In some implementations, generating the control signal can be performed based on a number of steps in the step value. The operations can further include repeating operations a)-g) for a subsequent time period with new values for one or more of the frequency, the number of measurement samples, or the voltage.

Some implementations can include a non-transitory computer readable medium having instructions stored therein that, when executed by one or more processors, cause the one or more processors to perform operations to control slip-stick stages. The operations can include a) obtaining a frequency, a number of measurement samples, and a voltage, b) determining a time period based on the number of measurement samples and the frequency, and c) sampling a displacement of an actuator of a slip-stick stage during the time period.

The operations can also include, for each sample taken during the time period: d) calculating an error value based on the displacement and a reference position, e) determining a step value based on the error value and a modulation protocol, wherein the modulation protocol includes one of a proportional modulation protocol or a proportional-integral modulation protocol, f) generating a control signal based on the step value, the frequency and the voltage, wherein the control signal is based on an integral of a function of voltage and a Heaviside function according to a direction specified by a sign of the step value, and g) transmitting the control signal to the actuator.

In some implementations, the actuator can include a piezo electric actuator. In some implementations, the actuator can include a piezo electric actuator and the stick-slip stage can include an end effector.

In some implementations, the proportional modulation protocol includes determining the step value according to:

$$u_{step} = \text{Int}(Ke(t)),$$

where K is a constant, e(t) is the error value and Int(s) represent the integer value of a real s.

In some implementations, the proportional-integral modulation protocol includes determining the step value according to:

$$u_{step}(t) = \text{Int}(K\,e(t) + K_I \int_0^t e(s)ds)$$

where K is a constant, t is time, e(t) is the error value and Int(s) represent the integer value of a real s.

In some implementations, generating the control signal is performed based on a number of steps in the step value. The operations can further include repeating operations a)-g) for a subsequent time period with new values for one or more of the frequency, the number of measurement samples, or the voltage.

Some implementations can include a method to control slip-stick stages. The method can include a) obtaining a frequency, a number of measurement samples, and a voltage, b) determining a time period based on the number of measurement samples and the frequency, and c) sampling a displacement of a slip-stick stage actuator during the time period.

The method can also include, for each sample taken during the time period: d) calculating an error value based on the displacement and a reference position, e) determining a step value based on the error value and a modulation protocol, wherein the modulation protocol includes one of a proportional modulation protocol or a proportional-integral modulation protocol, f) generating a control signal based on the step value, the frequency and the voltage, wherein the control signal is based on an integral of a function of voltage and a Heaviside function according to a direction specified by a sign of the step value, and g) transmitting the control signal to the actuator.

In some implementations, the actuator can include a piezo electric actuator. In some implementations, the actuator can include a piezo electric actuator and the stick-slip stage can include an end effector.

In some implementations, the proportional modulation protocol includes determining the step value according to:

$$u_{step} = \text{Int}(Ke(t)),$$

where K is a constant, e(t) is the error value and Int(s) represent the integer value of a real s.

In some implementations, the proportional-integral modulation protocol includes determining the step value according to:

$$u_{step}(t) = \text{Int}(K\, e(t) + K_I \int_0^t e(s)\,ds)$$

where K is a constant, t is time, e(t) is the error value and Int(s) represent the integer value of a real s.

The method can further include repeating a)-g) for a subsequent time period with new values for one or more of the frequency, the number of measurement samples, or the voltage.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
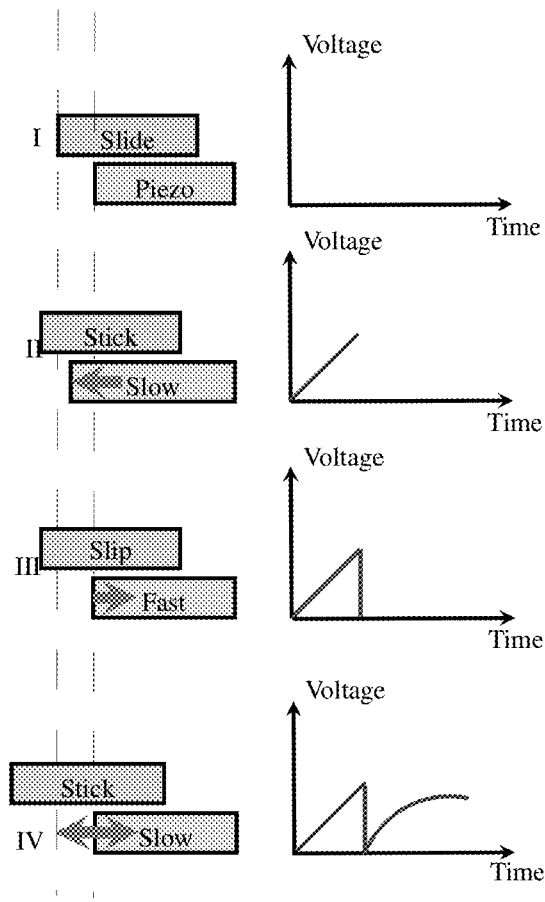
FIG. 1 is a diagram of stick and slip behavior under action of a sawtooth voltage in accordance with some implementations.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Figure 3:
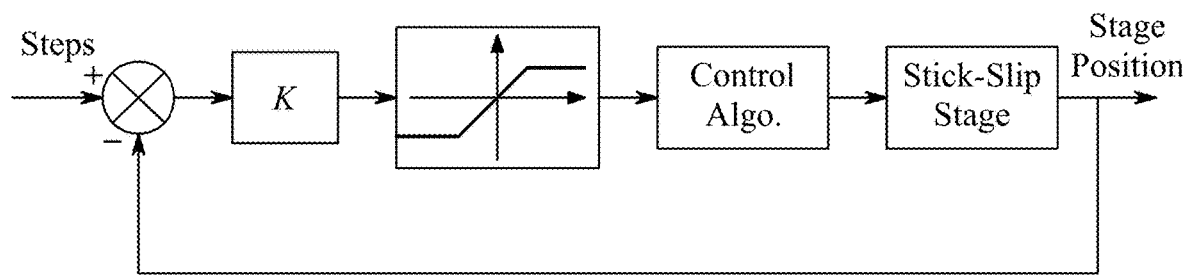
FIG. 3 is a diagram of an example control system in accordance with some implementations.

In some implementations, a slip-stick stage (such as that shown in FIG. 3) includes an actuator such as a piezoelectric ceramic actuator (or other piezoelectric actuator) that is preloaded against a moving runner or slide, generally called the end effector. Under control of a drive signal with a quasi-sawtooth shape, generated as described herein, the piezoelectric ceramic actuator expands slowly and contracts rapidly (or vice versa). During the slow expansion, the slide sticks to the actuator (denoted "piezo" in FIG. 1) and moves along, while during the rapid contraction, the actuator slips along the slide, which substantially stays in place relative to the slide, see FIG. 1. During the stick phase, the slide is moved in the defined direction. During the slip phase, the slide does not move. The so-called back-stepping effect leads to a small backward motion during the acceleration phase of the piezo-actuator. To clarify the principle of functioning of the stick-slip stage and the different modes shown in FIG. 1, three basic states are described as follows:

Initial state. At the beginning, the piezoelectric material of the piezoelectric ceramic actuator is at its normal length and no voltage is applied at this stage.

Stick state. In this state, the input voltage is increased gradually from 0 to 100V (e.g., the voltage can be increased from about 0V to about 100V in 0.3 to 5 seconds, preferably 0.4 to 2.5 seconds, 0.6 to 1 seconds or about 0.8 seconds). The length of piezoelectric material of the piezoelectric ceramic actuator is increased gradually. Because the movement of the piezoelectric material is significantly slow, the static friction between the slide and piezoelectric material is sufficient enough that they stick to each other. The slide (or end effector) which is placed on the piezoelectric material now moves along with the piezoelectric material.

Slip state. In this state, the input voltage is reduced abruptly (e.g., from about 100V to about 0V in 0.01 to less than 0.3 seconds, preferably 0.05 to 0.25 seconds, 0.1 to 0.2 seconds or about 0.2 seconds). The piezoelectric material of the piezoelectric ceramic actuator will contract back to its original length in very short time. Because the movement of piezoelectric material is very fast, the dynamic friction between the slide and piezoelectric material is not sufficient to hold them together. Thus, the slide slips on the piezo electric material and retains its extended position.

A. Single-Step-Control Stage

In the control method presented herein, the actuator can go through one complete stick cycle and one complete slip cycle. Each stick and slip cycle movement can include one step. By repeating multiple single steps an actuator can be controlled to move toward a desired position. Assume each step moves the positioner $\delta_{step}$ distance and the required length of movement is $L_d$ then, the single step control is repeated n times to move the positioner to a level where $n = \text{Int}(L_d/\delta_{step})$ can be determined, where Int(x) stands for the largest integer smaller than x. In a single-step-control stage, a system may be confined by the step size and the movement cannot be smaller than $\delta_{step}$; therefore, single-step-control stage is used for course movement of the stages.

Figure 2:
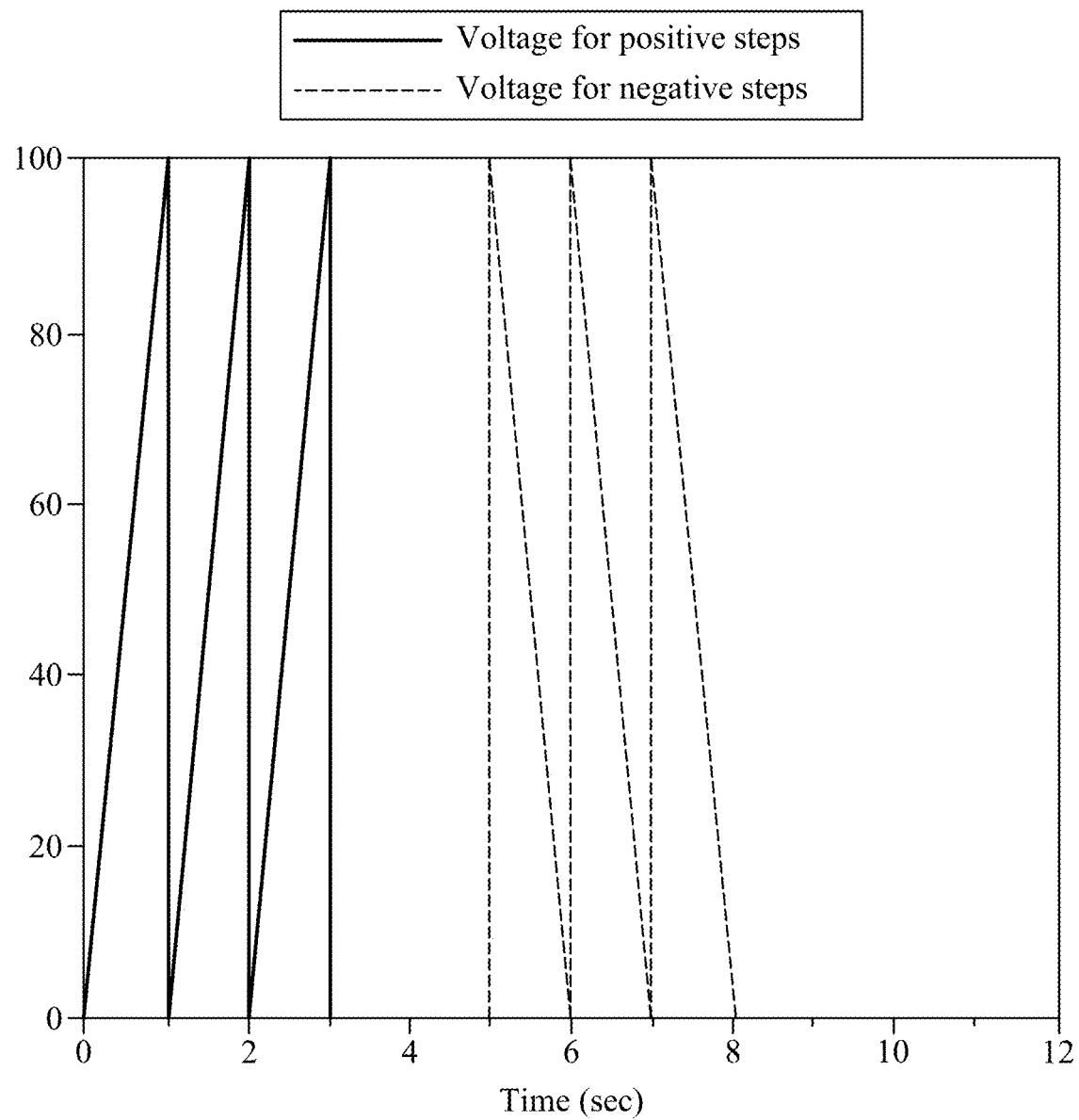
FIG. 2 is a diagram of an example sawtooth signal in accordance with some implementations.

Algorithm 1 shows how the control input is formed when the number of the steps $u_{step}$ is specified. In fact, the number of steps can be selected positive or negative to ensure the displacement of the stage in two directions and the control signal result of Algorithm 1 is based on an integral of a function of $V_{max}$ and a Heaviside function according to the direction specified by the sign of $u_{step}$. In FIG. 2, the saw-tooth signal is generated for two different numbers of $u_{step}$. During the time 0≤t≤5 three positive steps are required. At t=5 (sec), negative steps are required. As noticed from the graph of FIG. 2, the voltage U(t), that will be applied to the piezoelectric actuator, will return to zero when the number of the steps are realized. The precision of the state displacement depends essentially on $V_{max}$, f and the number of the steps. Parameters that define the shape of the saw-tooth signal can have a direct effect on the displacement variable. By increasing the number of the steps, the stage will travel for a longer distance, but its transient motion will depend on the frequency f and the maximum value of the voltage $V_{max}$. By increasing the frequency f, the displacement of the stage becomes more rapid and it plays a key role in defining and appending the transient behavior of the end effector. It is quite possible to define many criteria to modify these key parameters to ultimately define an acceptable transient and steady-state regime. In the example presented herein, $V_{max}$ and f are set to reasonable constants and the number of steps is the main control variable that defines the shape of the saw-tooth signal. In general, an objective of the presently disclosed technique is to modulate the saw-tooth signal by a time-varying number of steps in order to realize a precise and efficient displacement of the end-effector mass.

---

Algorithm 1 The generation of the applied input for a given $u_{step}$

---

Require: $u_{step}$, f, $V_{max}$ and $t_0$
1: if $t_0 < 0$ then
2:   Error("Time $t_0$ should be $\geq 0$");
3: else if $u_{step} > 0$ then 4: $U(t) \leftarrow \sum_{i=0}^{u_{step}-1} \left[ V_{max} f\left(i - \frac{i}{f} - i_0\right) \left[ \text{Heaviside}\left(i - \frac{i}{f} - i_0\right) - \text{Heaviside}\left(t - \frac{(i+1)}{f} - i_0\right) \right] \right];$ 5: else if $u_{step} < 0$ then 6: $U(t) \leftarrow \sum_{i=0}^{|u_{step}|-1} \left[ -V_{max} f\left(t - \frac{(i+1)}{f} - i_0\right) \left[ \text{Heaviside}\left(i - \frac{i}{f} - i_0\right) - \text{Heaviside}\left(t - \frac{(i+1)}{f} - i_0\right) \right] \right];$ 7: else
8:   $U(t) \leftarrow 0.$
9: end if
10: return $U(t)$

---

B. Proportional Modulation Implementation

Some implementations can include control to track a constant reference. In some implementations, a P-modulated saw-tooth signal can be generated between two successive samples of time. The term "P-modulation" as used herein refers to the type of variation of the steps of the saw-tooth signal, namely proportional modulation. Actually, the voltage command applied to PEA has a limited support of time. According to the desired steps, the saw-tooth signal will be non-null during the period $T_s$ defined as $T_s$=number of steps/f. The frequency of the saw-tooth signal is set constant and equal to 8000 Hz during the whole simulation.

The first control scheme consists of generating a time-varying saw-tooth signal that permits to increase and decrease the length of the piezoelectric material. Between two consecutive sampling instants, the number of the steps of the saw-tooth signal can be calculated as a function of the error signal between the actual displacement of the stage and the desired reference position. The number of the steps of the saw-tooth signal is seen as a control input. More precisely, $$u_{step} = \text{Int}(Ke(t)), \quad (1)$$

where "Int(s)" stands for the integer value of the real "s." Algorithm 2 shows how the saw-tooth voltage input is generated during two consecutive samples of time $t_k$ and $t_{k+1}$.

---

Algorithm 2 The control algorithm with P-modulated saw-tooth voltage

---

Require: Select an appropiate frequency f to generate the number of the steps. The period $\frac{1}{f}$ should be smaller than the time sampling period.
Require: Construct the feedback system shown in Fig. 3.
Require: Set $k_{max}$: the maximum number of measurement samples.
  $k \leftarrow 0.$
2: if $k \geq k_{max}$ then
    Go to End.
4: else
    During the time interval [$t_k$, $t_{k+1}$[, record the error $e(t_k)$.
6:   Evaluate -continued

---

Algorithm 2 The control algorithm with P-modulated saw-tooth voltage

---

$u_{step}(t_k) = \text{Int}(K\ e(t_k)).$ (2)
  Construct the voltage profile using Algorithm 1 by setting $u_{step} = u_{step}(t_k)$, $t_o = t_k$.
8: $k \leftarrow k + 1.$
  end if
10: END.

---

Figure 4:
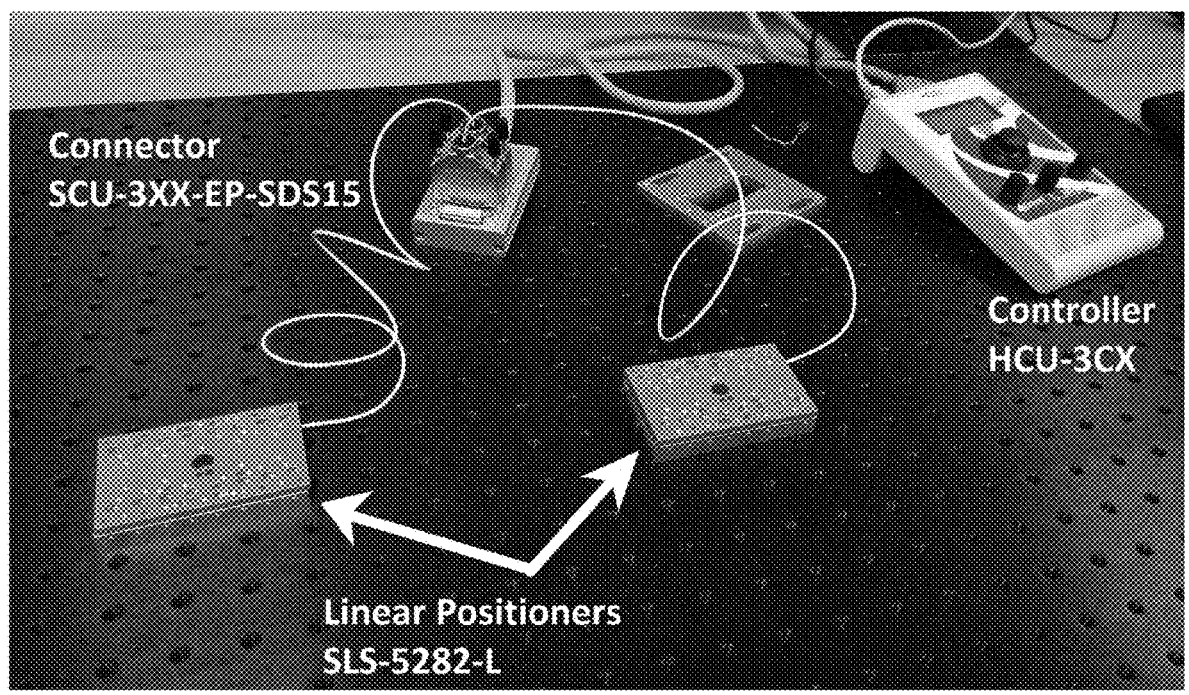
FIG. 4 shows an example linear positioning system in accordance with some implementations.
Figure 5:
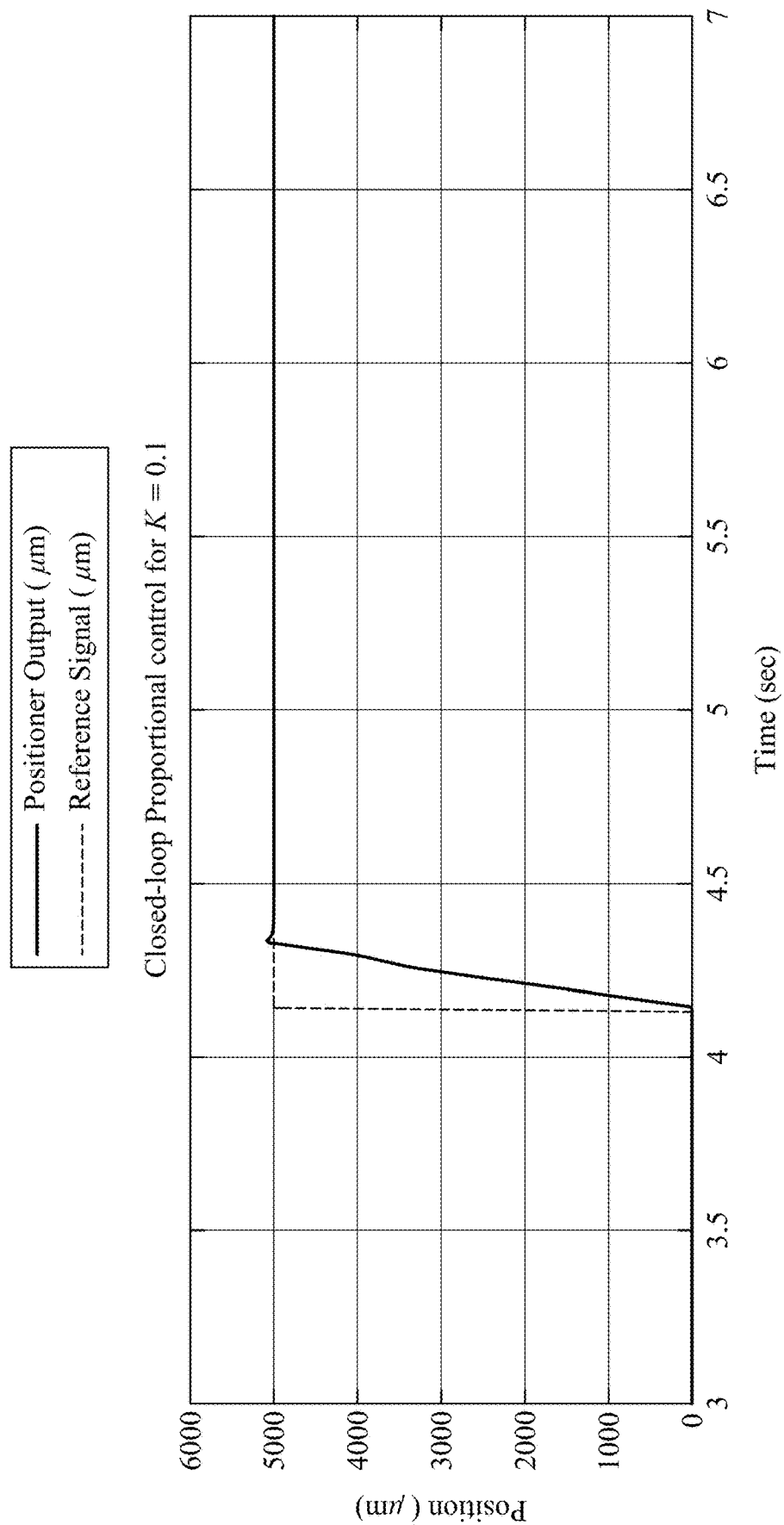
FIG. 5 is a graph showing stage displacement under a P-modulated sawtooth control input in accordance with some implementations.

In testing, a SmarAct linear positioner, referenced SLS-5282-L with an integrated position sensor has been used, see FIG. 4. Example real-time simulation results, shown in FIG. 5, are realized with Labview 2018 for a regular sampling time $\delta t_k = t_k - t_{k-1} = 0.01$ (sec), f=8000 Hz and $V_{max}$=100.

Figure 6:
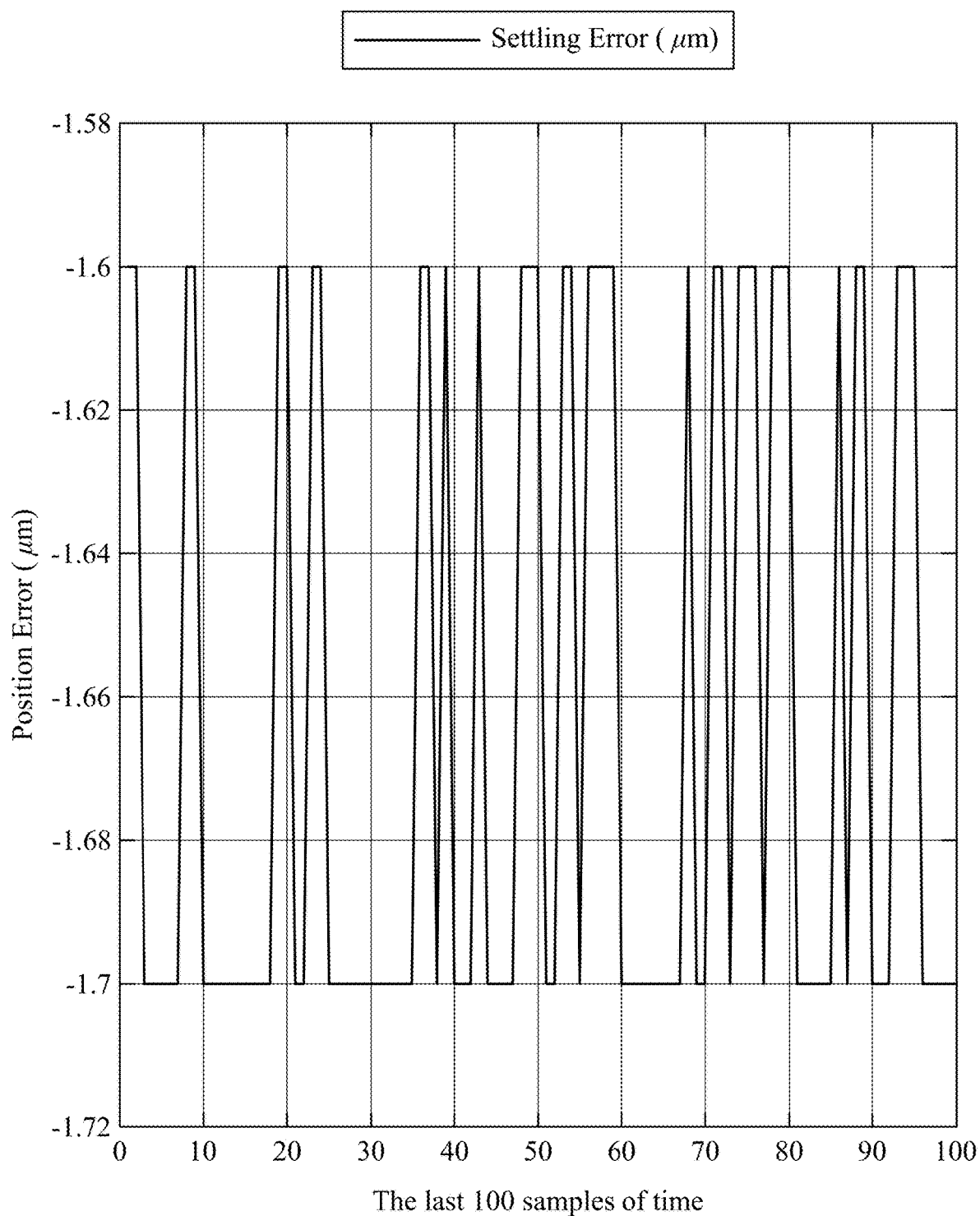
FIG. 6 is a graph showing an example error signal in accordance with some implementations.
Figure 7:
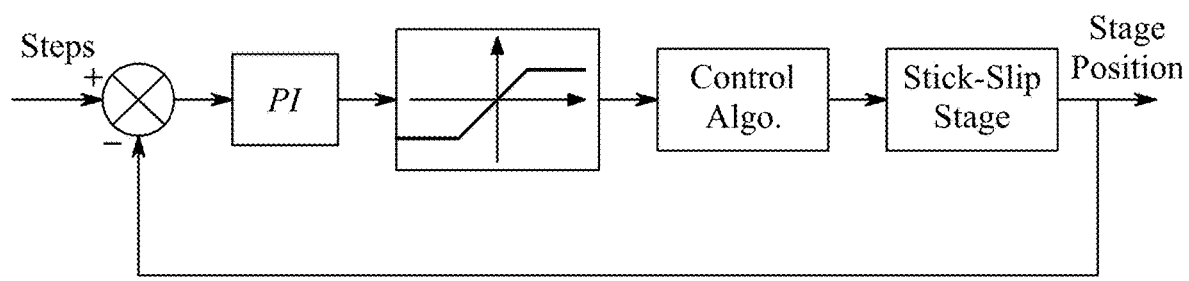
FIG. 7 is a diagram of an example control system in accordance with some implementations.

Between two consecutive samples of time, a saw-tooth signal of number of steps $u_{step}$=Int(Ke(t)) is applied to PEA. This type of control is very simple and efficient in the sense that a rapid convergence is obtained with an error that does not exceed 2 μm. As shown in FIG. 6, the error signal when time elapses is very weak as compared to the long travel of the stage 5000 μm.

C. Proportional and Integral Modulation

Some implementations can include a second control scheme that consists of modulating the saw-tooth control signal by a time-varying number of steps that are calculated as a function depending on both the instantaneous value of the error and its integral between the initial time and the current time. For each sample of time, the number of steps is calculated as $$u_{step}(t) = \text{Int}(K\, e(t) + K_I \int_0^t e(s)ds). \quad (3)$$

Figure 8:
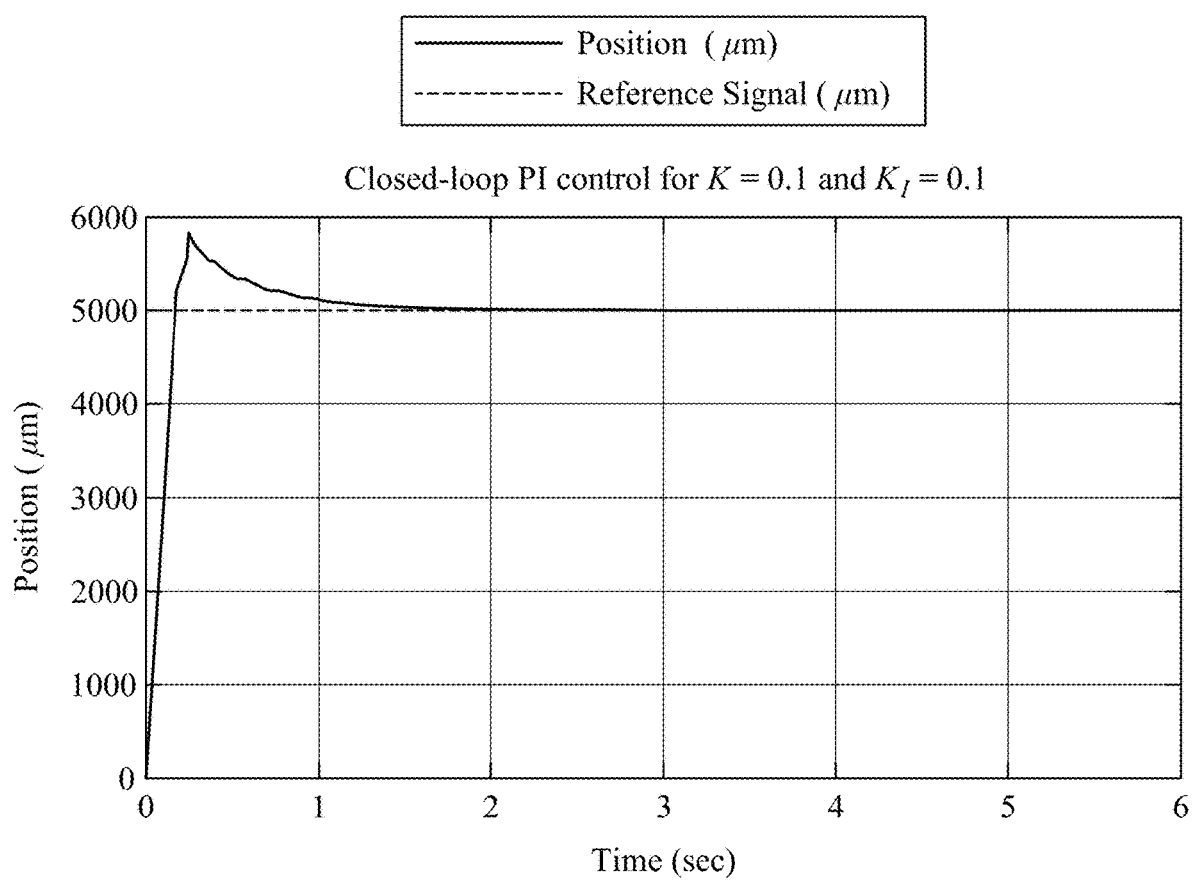
FIG. 8 is a graph showing example stage displacement in accordance with some implementations.
Figure 9:
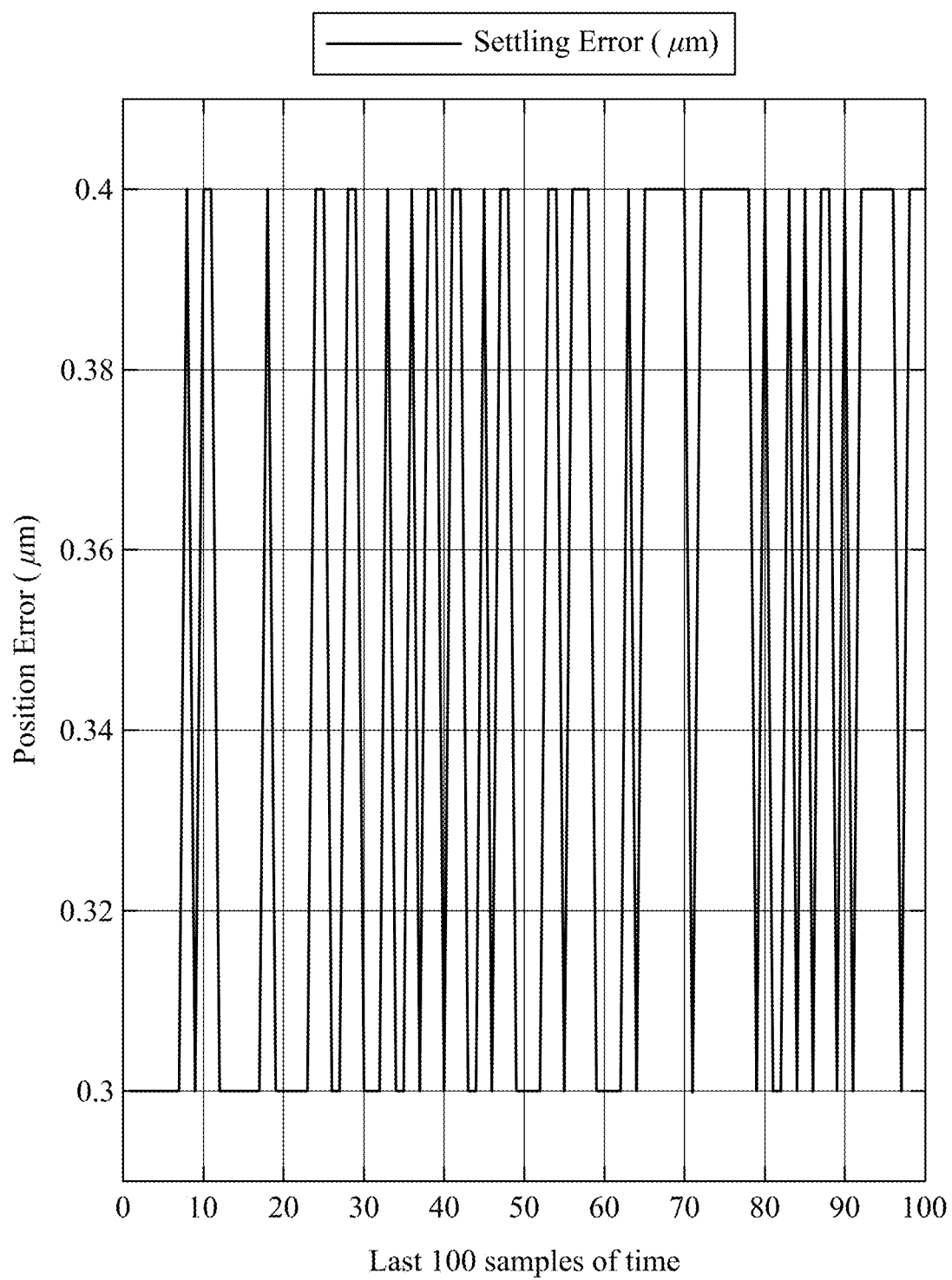
FIG. 9 is a graph showing an example error signal in accordance with some implementations.

Depending on the sign of $u_{step}(t)$, two different forms of the saw-tooth signal are generated, see FIG. 2. The control design is summarized in Algorithm 3. The real-time experiment is conducted for f=8000 Hz and $V_{max}$=100 V, K=KI=0.1, and δt=0.01 (sec). The results of simulations are shown in FIG. 8 and FIG. 9. It is apparent that the PI-based control action provides better precision in tracking of constant signals. The parameters K and KI can be also chosen to improve the transient behavior of the stage response. This analysis is not provided herein because of the absence of an accurate model of the stick-slip stage.

---

Algorithm 3 The control strategy of the PI-modulated sawtooth voltage

---

Require: Set the maximum value of the time samples $k_{max}$.
Require: Select an appropriate frequency f to generate the
    number of the steps. The period 1/f should be smaller
    than the time sampling period.
Require: Construct the feedback system shown in Fig, 7.
  1: k ← 0.
  2: if k ≥ $k_{max}$ then
  3:   Go to END.
  4: else
  5:   During the time interval $[t_k, t_{k+1}[$, record the error
       $e(t_k)$.
  6:   Evaluate $$u_{step}(t_k) = \text{Int}\left(Ke(t_k) + K_I \int_0^{\tau_k} e(s)ds\right). \quad (4)$$

7:   Construct the voltage to be applied to PEA using
       Algorithm 1 by setting $u_{step} = u_{step}(t_k)$, $t_o = t_k$.
  8:   k ← k + 1.
  9: end if
 10: END.

---

Control strategies based on the variation of the number of steps of the saw-tooth applied voltage provided excellent results compared to open-loop control methodologies.

By updating the number of the steps during two consecutive samples of time, the convergence to the desired reference becomes fast and precise. The increase and the decrease of the maximum voltage of the saw-tooth signal plays a key role in making the reference tracking more accurate.

In some implementations, the controllers described herein can be used to control slip-stick positioning stages in a variety of applications requiring precise motion control and positioning. In addition to a single slip-stick stage providing one axis of control, multiple slip-stick stage positioners and associated controllers as described herein can be combined to provide a multi-axis positioning system.

Applications for slip-stick stages controlled according to one or more implementations described herein can include precision motion control for use in optics, bio-technology, photonics, and semiconductor fields, among others. In general, an implementation of the disclosed controller or control techniques can be suitable for use where precision motion control or positioning of a piezoelectric stick-slip stage is required. For example, a slip-stick stage linear actuator with a controller as described herein can serve as a base for a goniometer. A linear positioning stage with a controller as described herein can be combined with a rotation stage to yield a rotational actuator with precise motion control.

Figure 10:
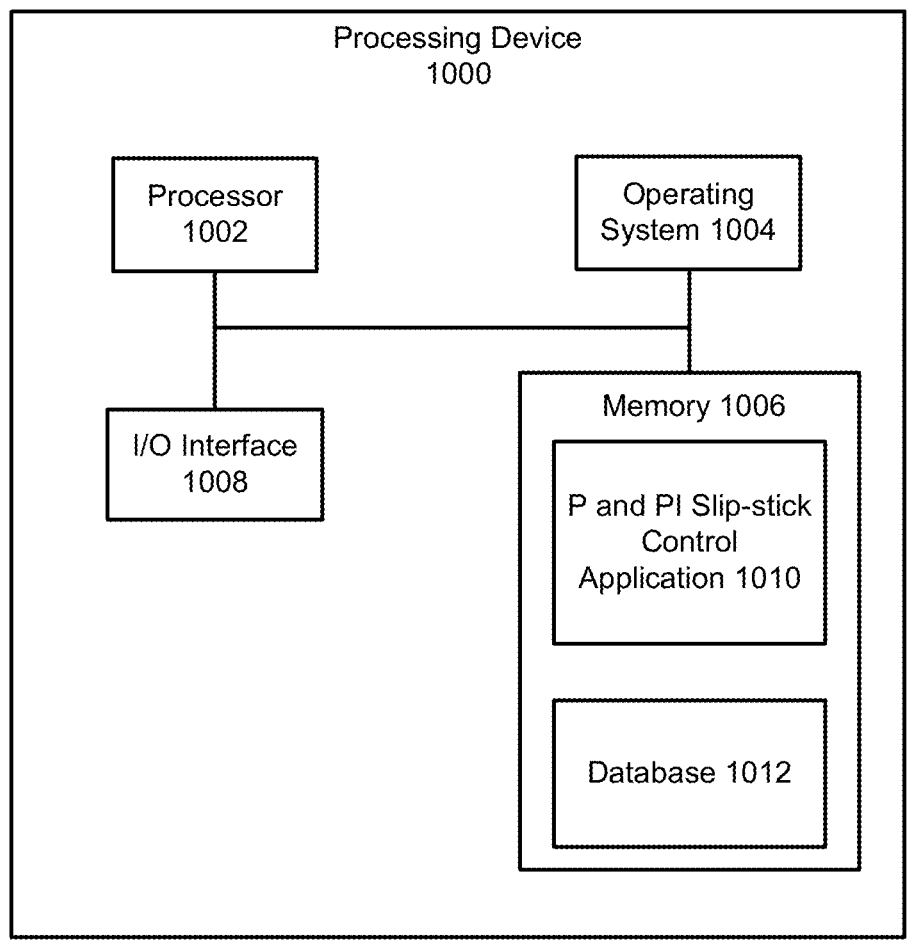
FIG. 10 is a diagram of an example processing system in accordance with some implementations.

FIG. 10 is a block diagram of an example processing device 1000 which may be used to implement one or more features described herein. In one example, device 1000 may be used to implement a computer device including control of slip-stick stages using P and PI sawtooth modulated inputs as described herein and perform appropriate method implementations described herein. Device 1000 can be any suitable computer system, server, or other electronic or hardware device. For example, the device 1000 can be an actuator controller, a mainframe computer, desktop computer, workstation, portable computer, or electronic device (portable device, mobile device, cell phone, smart phone, tablet computer, television, TV set top box, personal digital assistant (PDA), media player, game device, wearable device, etc.). In some implementations, device 1000 includes a processor 1002, an operating system 1004, a memory 1006, and input/output (I/O) interface 1008.

Processor 1002 can be one or more processors and/or processing circuits to execute program code and control basic operations of the device 1000. A "processor" includes any suitable hardware and/or software system, mechanism or component that processes data, signals or other information. A processor may include a system with a general-purpose central processing unit (CPU), multiple processing units, dedicated circuitry for achieving functionality, or other systems. Processing need not be limited to a particular geographic location, or have temporal limitations. For example, a processor may perform its functions in "real-time," "offline," in a "batch mode," etc. Portions of processing may be performed at different times and at different locations, by different (or the same) processing systems. A computer may be any processor in communication with a memory.

Memory 1006 is typically provided in device 1000 for access by the processor 1002, and may be any suitable processor-readable storage medium, e.g., random access memory (RAM), read-only memory (ROM), Electrical Erasable Read-only Memory (EEPROM), Flash memory, etc., suitable for storing instructions for execution by the processor, and located separate from processor 1002 and/or integrated therewith. Memory 1006 can store software operating on the device 1000 by the processor 1002, including an operating system 1004, one or more P or PI modulated slip-stick control applications 1010, and a database 1012. In some implementations, applications 310 can include instructions that enable processor 1002 to perform the functions described herein.

For example, application 1010 can include control of slip-stick stages using P and PI sawtooth modulated inputs as described herein. Any of software in memory 1004 can alternatively be stored on any other suitable storage location or computer-readable medium. In addition, memory 1004 (and/or other connected storage device(s)) can store machine learning model (e.g., SVM) information, and/or other instructions and data used in the features described herein. Memory 1004 and any other type of storage (magnetic disk, optical disk, magnetic tape, or other tangible media) can be considered "storage" or "storage devices."

I/O interface 1008 can provide functions to enable interfacing the processing device 1000 with other systems and devices. For example, network communication devices, storage devices (e.g., memory and/or database), and input/output devices can communicate via interface 308. In some implementations, the I/O interface 1008 can connect to interface devices including input devices (keyboard, pointing device, touchscreen, microphone, camera, scanner, etc.) and/or output devices (display device, speaker devices, printer, motor, etc.).

For ease of illustration, FIG. 10 shows one block for each of processor 1002, memory 1006, I/O interface 1008, and software block 1010. These blocks may represent one or more processors or processing circuitries, operating systems, memories, I/O interfaces, applications, and/or software modules. In other implementations, device 1000 may not have all of the components shown and/or may have other elements including other types of elements instead of, or in addition to, those shown herein.

In general, a computer that performs the processes described herein can include one or more processors and a memory (e.g., a non-transitory computer readable medium). The process data and instructions may be stored in the memory. These processes and instructions may also be stored on a storage medium such as a hard drive (HDD) or portable storage medium or may be stored remotely. Note that each of the functions of the described embodiments may be implemented by one or more processors or processing circuits. A processing circuit can include a programmed processor, as a processor includes circuitry. A processing circuit/circuitry may also include devices such as an application specific integrated circuit (ASIC) and conventional circuit components arranged to perform the recited functions. The processing circuitry can be referred to interchangeably as circuitry throughout the disclosure. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device.

The processor may contain one or more processors and even may be implemented using one or more heterogeneous processor systems. According to certain implementations, the instruction set architecture of the processor can use a reduced instruction set architecture, a complex instruction set architecture, a vector processor architecture, a very large instruction word architecture. Furthermore, the processor can be based on the Von Neumann model or the Harvard model. The processor can be a digital signal processor, an FPGA, an ASIC, a PLA, a PLD, or a CPLD. Further, the processor can be an x86 processor by Intel or by AMD; an ARM processor, a Power architecture processor by, e.g., IBM; a SPARC architecture processor by Sun Microsystems or by Oracle; or other known CPU architecture.

The functions and features described herein may also be executed by various distributed components of a system. For example, one or more processors may execute the functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed. A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, an implementation may be performed on modules or hardware not identical to those described. Accordingly, other implementations are within the scope that may be claimed.

The invention claimed is:

1. A system to control slip-stick stages, the system comprising:
a slip-stick stage including an actuator; and
one or more processors coupled to the actuator and a nontransitory computer readable storage having software instructions stored thereon that, when executed, cause the one or more processors to perform operations including:
  a) obtaining a frequency, a number of measurement samples, and a voltage;
  b) determining a time period based on the number of measurement samples and the frequency;
  c) sampling a displacement of the actuator during the time period; for each sample taken during the time period:
  d) calculating an error value based on the displacement and a reference position;
  e) determining a step value based on the error value and a modulation protocol, wherein the modulation protocol includes one of a proportional modulation protocol or a proportional-integral modulation protocol;
  f) generating a control signal based on the step value, the frequency and the voltage, wherein the control signal is based on an integral of a function of voltage and a Heaviside function according to a direction specified by a sign of the step value; and
  g) transmitting the control signal to the actuator.

2. The system of claim 1, wherein the actuator is a piezo electric actuator.

3. The system of claim 1, wherein the actuator is a piezo electric and the stick-slip stage further includes an end effector.

4. The system of claim 1, wherein the proportional modulation protocol includes determining the step value according to:

$$u_{step} \text{Int}(Ke(t)),$$

where K is a constant, e(t) is the error value and Int(s) represent an integer value of a real s.

5. The system of claim 1, wherein the proportional-integral modulation protocol includes determining the step value according to:

$$u_{step}(t) = \text{Int}(K\,e(t) + K_I \int_0^t e(s)\,ds)$$

where K is a constant, t is time, e(t) is the error value and Int(s) represent an integer value of a real s.

6. The system of claim 1, wherein generating the control signal is performed based on a number of steps in the step value.

7. The system of claim 1, wherein the operations further include repeating operations a)-g) for a subsequent time period with new values for one or more of the frequency, the number of measurement samples, or the voltage.

8. A non-transitory computer readable medium having instructions stored therein that, when executed by one or more processors, cause the one or more processors to perform operations to control slip-stick stages, the operations comprising:
   a) obtaining a frequency, a number of measurement samples, and a voltage;
   b) determining a time period based on the number of measurement samples and the frequency;
   c) sampling a displacement of an actuator of a slip-stick stage during the time period;
   for each sample taken during the time period:
   d) calculating an error value based on the displacement and a reference position;
   e) determining a step value based on the error value and a modulation protocol, wherein the modulation protocol includes one of a proportional modulation protocol or a proportional-integral modulation protocol;
   f) generating a control signal based on the step value, the frequency and the voltage, wherein the control signal is based on an integral of a function of voltage and a Heaviside function according to a direction specified by a sign of the step value; and
   g) transmitting the control signal to the actuator.

9. The non-transitory computer readable medium of claim 8, wherein the actuator is a piezo electric actuator.

10. The non-transitory computer readable medium of claim 8, wherein the actuator is a piezo electric actuator and the stick-slip stage includes an end effector.

11. The non-transitory computer readable medium of claim 8, wherein the proportional modulation protocol includes determining the step value according to:

$$u_{step}(t) = \text{Int}(Ke(t))$$

where K is a constant, e(t) is the error value and Int(s) represent an integer value of a real s.

12. The non-transitory computer readable medium of claim 8, wherein the proportional-integral modulation protocol includes determining the step value according to:
ti $u_{step}(t) = \text{Int}(K\,e(t) + K_I \int_0^t e(s)ds)$
   where K is a constant, t is time, e(t) is the error value and Int(s) represent an integer value of a real s.

13. The non-transitory computer readable medium of claim 8, wherein generating the control signal is performed based on a number of steps in the step value.

14. The non-transitory computer readable medium of claim 8, wherein the operations further include repeating operations a)-g) for a subsequent time period with new values for one or more of the frequency, the number of measurement samples, or the voltage.

15. A method to control slip-stick stages, the method comprising:
   a) obtaining a frequency, a number of measurement samples, and a voltage;
   b) determining a time period based on the number of measurement samples and the frequency;
   c) sampling a displacement of an actuator of a slip-stick stage during the time period;
   for each sample taken during the time period:
   d) calculating an error value based on the displacement and a reference position;
   e) determining a step value based on the error value and a modulation protocol, wherein the modulation protocol includes one of a proportional modulation protocol or a proportional-integral modulation protocol;
   f) generating a control signal based on the step value, the frequency and the voltage, wherein the control signal is based on an integral of a function of voltage and a Heaviside function according to a direction specified by a sign of the step value; and
   g) transmitting the control signal to the actuator.

16. The method of claim 15, wherein the actuator is a piezo electric actuator.

17. The method of claim 15, wherein the actuator is a piezo electric actuator and the stick-slip stage includes an end effector.

18. The method of claim 15, wherein the proportional modulation protocol includes determining the step value according to:

$$u_{step} = \text{Int}(Ke(t))$$

where K is a constant, e(t) is the error value and Int(s) represent an integer value of a real s.

19. The method of claim 15, wherein the proportional-integral modulation protocol includes determining the step value according to:

$$u_{sep}(t) = \text{Int}(K\,e(t) + K_I \int_0^t e(s)ds)$$

where K is a constant, t is time, e(t) is the error value and Int(s) represent an integer value of a real s.

20. The method of claim 15, further comprising repeating a)-g) for a subsequent time period with new values for one or more of the frequency, the number of measurement samples, or the voltage.

* * * * *